(12) United States Patent
Chu et al.

(10) Patent No.: US 11,545,940 B2
(45) Date of Patent: Jan. 3, 2023

(54) BLEEDER CIRCUITRY FOR AN ELECTRONIC DEVICE

(71) Applicant: Micron Technology, Inc., Boise, ID (US)

(72) Inventors: Wei Lu Chu, Pudong (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/243,762

(22) Filed: Apr. 29, 2021

(65) Prior Publication Data

US 2022/0352855 A1    Nov. 3, 2022

(51) Int. Cl.
  *H03F 1/30*    (2006.01)
  *G05F 3/26*    (2006.01)
  *H03F 3/45*    (2006.01)
  *H03F 3/213*   (2006.01)

(52) U.S. Cl.
  CPC ............ *H03F 1/301* (2013.01); *G05F 3/262* (2013.01); *H03F 3/213* (2013.01); *H03F 3/45112* (2013.01); *H03F 3/45273* (2013.01)

(58) Field of Classification Search
  CPC ... H03F 1/30; H03F 1/301; H03F 3/20; H03F 3/21; H03F 3/211; H03F 3/213; H03F 3/45; H03F 3/45071; H03F 3/45179; H03F 3/45273; H03F 2200/474; H03F 2203/21127
  See application file for complete search history.

(56) References Cited

U.S. PATENT DOCUMENTS 10,614,860 B1 *  4/2020  Chu ................. G11C 5/148
10,998,010 B2 *  5/2021  Chu ................. G11C 5/148

* cited by examiner

*Primary Examiner* — Long Nguyen
(74) *Attorney, Agent, or Firm* — Fletcher Yoder, P.C.

(57) ABSTRACT

Devices and methods include voltage buses. The devices also include one or more power amplifiers coupled to the voltage bus. Each of the one or more power amplifiers include one or more transistors. The devices also include a model that is configured to emulate leakage from at least one of the one or more transistors. A current mirror with a first transistor coupled to the model and a second transistor coupled to the voltage bus. The current mirror is configure to draw charge from the voltage bus based at least in part on the emulated leakage from the model.

21 Claims, 3 Drawing Sheets

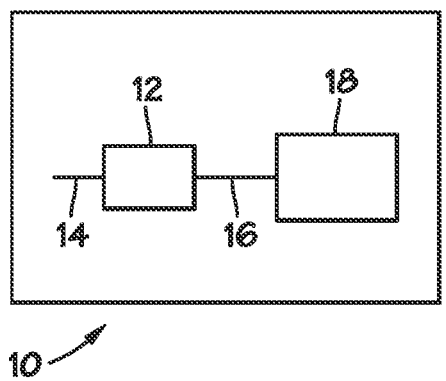
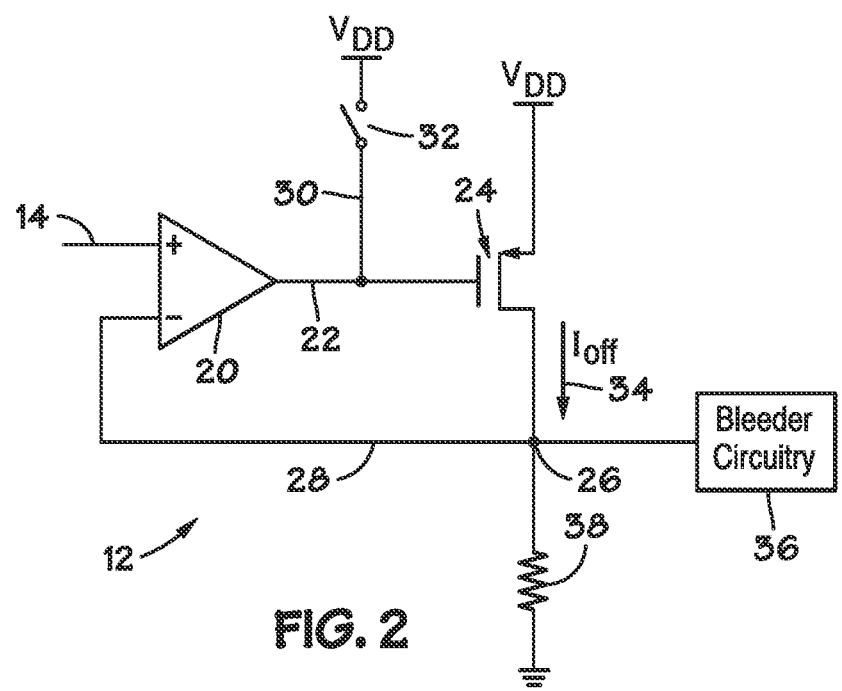

BLEEDER CIRCUITRY FOR AN ELECTRONIC DEVICE

BACKGROUND

Field of the Present Disclosure

Embodiments of the present disclosure relate generally to sinks for electrical charges in electronic devices. For example, bleeder circuitry may be used to sink current from one or more transistors (e.g., PMOS) to mitigate voltage drift on one or more voltage buses due to leakage currents.

Description of Related Art

Various operations in a memory device and/or other electronic devices may rely on power amplifiers that utilize one or more transistors. For example, the one or more transistors may include p-channel metal oxide semiconductor (PMOS) transistors and/or n-channel metal oxide semiconductor (NMOS) transistors. The power amplifiers may utilize the one or more transistors to provide a relatively large current (e.g., 1 mA) for the memory device and/or electronic device. However, the one or more transistors may leak some current during some standby modes. For instance, the one or more transistors may leak switch-off currents (Ioff) when the one or more transistors are turned off. Bleeder circuitry may be used to sink the leakage currents to maintain a bus voltage. However, some implementations of bleeder circuitry may be relatively large when numerous (e.g., 100 or more) power amplifiers are used in the memory device and/or other electronic devices. This is especially true for amplifier-based bleeder circuitry implementations. Additionally, the bleeder circuitry may consume additional power (e.g., via amplifiers) that wastes power. Indeed, some amplifier-based bleeder circuitries may consume power even when the bleeder circuitry is not bleeding current from a connected voltage bus.

Embodiments of the present disclosure may be directed to one or more of the problems set forth above.

BRIEF DESCRIPTION OF DRAWINGS

FIG. 1 is a simplified block diagram illustrating an electronic device having one or more power amplifiers, according to an embodiment of the present disclosure;

FIG. 2 is a circuit diagram of a power amplifier and bleeder circuitry of the electronic device of FIG. 1, according to an embodiment of the present disclosure;

DETAILED DESCRIPTION

Figure 3:
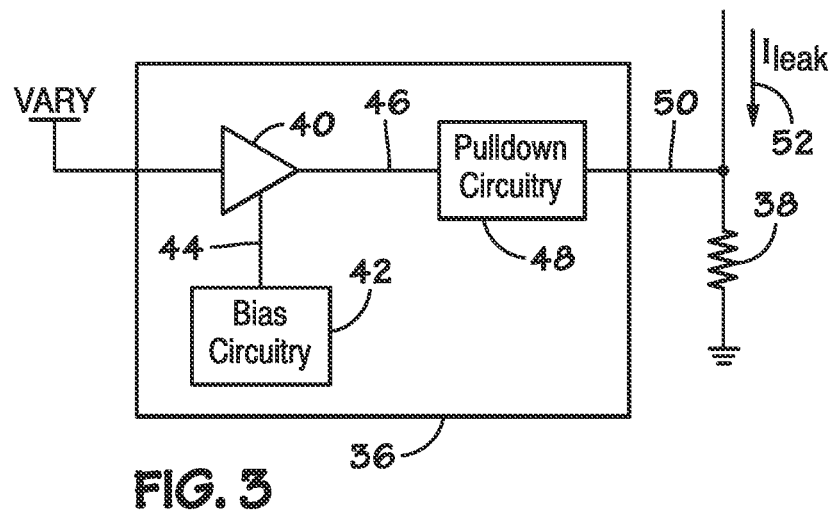
FIG. 3 is a block diagram of an amp-based embodiment of the bleeder circuitry of FIG. 2, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously discussed, bleeder circuitry may be used to sink the leakage currents to maintain a bus voltage. However, amplifier-based implementations of bleeder circuitry may be relatively large when numerous (e.g., 100 or more) power amplifiers are used in the memory device and/or other electronic devices. Additionally, the bleeder circuitry may consume additional power (e.g., via amplifiers) that wastes power, such as consuming power even when the bleeder circuitry is not actively bleeding off charge from a voltage bus or when bleeding off currents of various sizes. Instead, as discussed below, a current-mirror-based implementation of bleeder circuitry may consume less power and size. The current-mirror-based implementation includes one or more (e.g., 2) current mirrors. As discussed below, the current-mirror-based implementation of the bleeder circuitry may include a model configured to model leakage from at least one of the one or more transistors of the power amplifiers. For instance, the model may include a transistor of a same type and size as a transistor of a single power amplifier. For example, the model transistor may be a p-channel metal oxide semiconductor (PMOS) transistor that is the same size as the PMOS transistors in the power amplifiers.

One leg of one of the current mirrors couples to the model and another leg of the same current mirror couples to the voltage bus that has a voltage that may fluctuate due to leakages in the power amplifiers. The gates of transistors of the two legs of the current mirror are coupled together to implement the current mirror. A size of the transistor of the left leg may be proportional to a size of the transistor of the right leg. For instance, the transistor of the left leg may be N times larger than the transistor of the right leg. N is the number of power amplifier transistors whose leakage is being mitigated. The transistors of the right and left legs are of a same type, such as PMOS-type transistors.

The bleeder circuitry also includes another current mirror with a left leg coupled to the left leg of the other current mirror and a right leg coupled to the right leg of the other current mirror. The transistors of the left and right legs of this current mirror are also proportional with the transistor of the left leg being N times larger than the transistor of the right leg with N being the number of power amplifier transistors whose leakage is being mitigated. These transistors may be the same type as each other while being of a different type than the transistors of the other current mirror. For instance, the transistors of the left and right legs may be n-channel metal oxide semiconductor (NMOS) transistors connected to the PMOS transistors of the other current mirror.

In some situations, the bleeder circuitry may be susceptible to an independent operation of the two between the two current mirrors. For instance, during a startup of the electronic device or the bleeder circuitry, at least one of the current mirrors may independently loop. To balance the current mirrors during the startup, a startup transistor may be coupled between the gates of the transistors of the first current mirror and the gates of the transistors of the second current mirror.

Turning now to the figures, FIG. 1 is a simplified block diagram illustrating certain features of an electronic device 10 having one or more power amplifiers 12. Specifically, the block diagram of FIG. 1 is a functional block diagram illustrating only certain functionality of the electronic device 10. The power amplifiers 12 amplify signals/voltages/currents to a desired amplified level. In accordance with one embodiment, the electronic device 10 may be a double data rate type five synchronous dynamic random access memory (DDR5 SDRAM) device or a double data rate type four synchronous dynamic random access memory (DDR4 SDRAM). Additionally or alternatively, the electronic device 10 may include any type of electronic device that includes the one or more power amplifiers 12. The one or more power amplifiers 12 receive an input power level 14 (e.g., voltage and/or current) and outputs an amplified power level 16 that is transmitted to target circuitry 18 that utilizes the amplified power level 16. The target circuitry 18 may include any circuitry in the electronic device 10 that performs one or more functions using the amplified power level 16. For example, the amplified power level 16 may include an array voltage provided to the target circuitry 18 as a memory array of the electronic device 10. Furthermore, the amplified power level 16 may be delivered using a power bus. For instance, the array voltage may be provided to the memory array via an array voltage bus.

FIG. 2 is a block diagram of an embodiment of the power amplifier 12. As illustrated, the power amplifier 12 receives the input power level 14 at an amplifier 20 that outputs a gate voltage 22 to a gate of a transistor 24. In some embodiments, the input power level 14 may be input to the amplifier 20 at a non-inverting input of the amplifier 20. The value of the gate voltage 22 controls how much current passes through the transistor 24 from a supply voltage (VDD). The transistor 24 may include a p-channel metal-oxide-semiconductor (PMOS) transistor that is large enough to provide the amplified power level 16 to a node 26 using the VDD. For example, the node 26 may be coupled to a bus and/or the target circuitry 18. The node 26 may be connected to ground through some resistance 38. For instance, the resistance 38 may include the overall resistance between the node 26 and ground through the target circuitry 18. The value of the node 26 may also be fed back to the amplifier 20. For example, the feedback from the node may be applied to an inverting input of the amplifier 20. The amplified power level 16 may only be used when the power amplifier 12 is in an active mode, such as when the target circuitry 18 has a demand. At other times, the power amplifier 12 may be in standby or off modes. In many electronic devices, the amplified power level 16 may be in the standby mode most of the time.

To place the power amplifier 12 in a standby mode, the gate voltage 22 may be pulled high to VDD via a line 30. This line 30 may be used to dynamically pull the gate voltage 22 to VDD using a switch 32. In other words, when the switch closes the connection between the gate of the transistor and the VDD connection via the line 30, the gate voltage and the source voltage are tied to the VDD. Accordingly, the gate-to-source voltage is negligible thereby causing the transistor 24 to switch off. However, when the gate voltage 22 is pulled to VDD causing the transistor 24 to turn off, the transistor 24 may leak some current Ioff 34. Ioff 34 may be leaked due to the switching from an active mode to a standby mode for the power amplifier 12 and/or may be leaked during the standby mode. The electronic device 10 may sink this leaked current Ioff 34 with a dynamic connection to ground. However, if the electronic device 10 includes many (e.g., 100+) power amplifiers 12 in an electronic device 10 each having their own Ioff 34 (e.g., 1 mA), the amount of current to sink may be too big for simple ground connections to sink properly. Instead, bleeder circuitry 36 may be used to bleed off the Ioff 34 from the power amplifiers.

FIG. 3 is a block diagram of an embodiment of the bleeder circuitry 36 of FIG. 2 implemented using an amplifier 40. The amplifier 40 is coupled to some voltage bus, such as a voltage bus for a memory array (VARY), from which leakage charge is to be dissipated by the bleeder circuitry 36. Additionally or alternatively, the voltage to the amplifier 40 may be a reference voltage indicative of a voltage of the voltage bus. The amplifier 40 is also coupled to bias circuitry 42 that provides a bias voltage 44 to the amplifier 40 to enable the amplifier to amplify the voltage from the voltage bus to an appropriate level in an amplified voltage 46. The amplified voltage 46 is provided to pulldown circuitry 48. The pulldown circuitry 48 is used to pull down a voltage 50 to bleed off Ileak 52 (e.g., Ioff 34) from the voltage bus. Although the bleeder circuitry 36 may be successfully implemented using the amplifier-based implementation shown, the amplifier-based implementation may consistently consume a relatively large current (e.g., 8-10 microamps) regardless of how much charge is being dissipated. Additionally, the amplifier-based implementation may consume a relatively large size (e.g., 1,400 square micrometers) relative to a size of a bonding pad (e.g., 4,000 square micrometers) regardless of whether the amplifier-based implementation is not large relative to the size of an overall chip.

Figure 4:
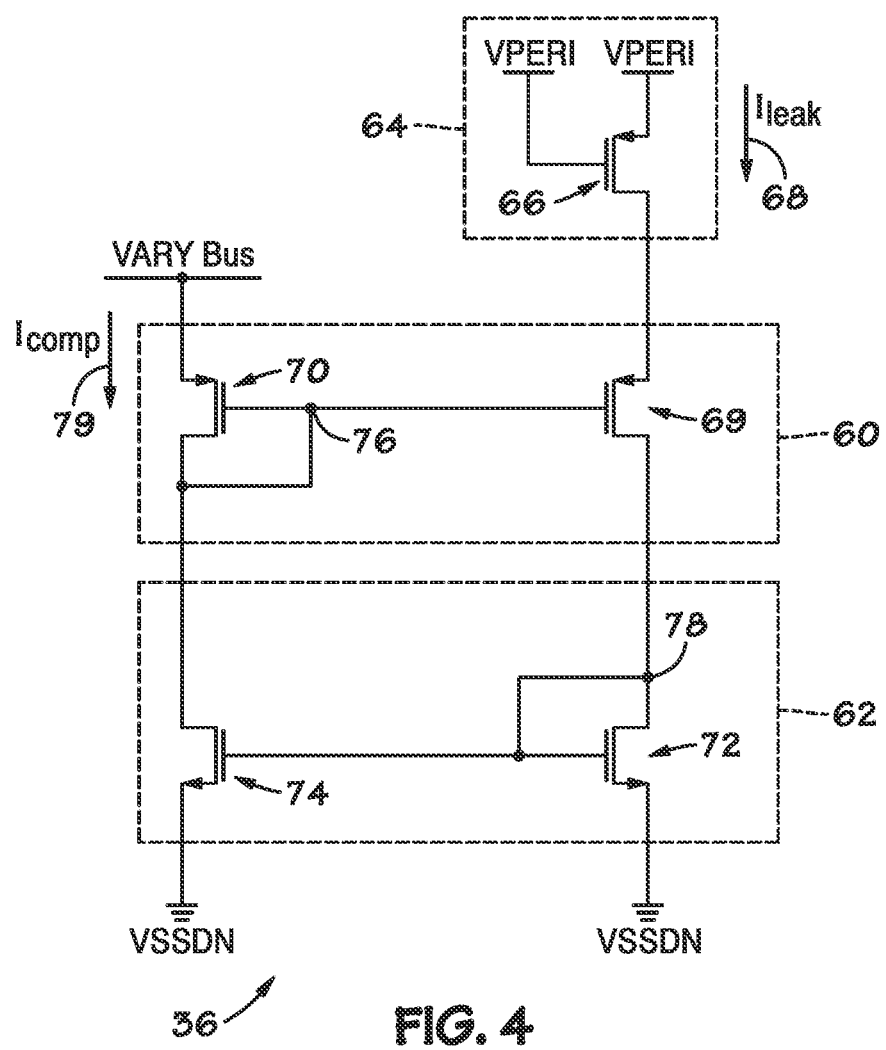
FIG. 4 is a circuit diagram of a current-mirror-based implementation of the bleeder circuitry of FIG. 2, according to an embodiment of the present disclosure.

In addition or alternative to the amplifier-based implementation of the bleeder circuitry 36, the bleeder circuitry 36 may be implemented using a current-mirror-based implementation as illustrated in FIG. 4. As such, FIG. 4 is a schematic diagram of an embodiment of the bleeder circuitry 36 using a current-mirror-based implementation. In the illustrated current-mirror-based implementation, the bleeder circuitry 36 may utilize current mirrors 60 and 62 to bleed off leakage current/excess charge. Additionally, the bleeder circuitry 36 may include a model 64 that includes a transistor 66 that is connected to a voltage VPERI at a source and gate of the transistor 66. The transistor 66 may include a PMOS-type transistor. The voltage VPERI may be the same voltage or a similar voltage to the voltages applied to power amplifiers 12. Using this voltage, the transistor 66 is used to generate Ileak 68 that emulates/models leakages at power amplifiers in the electronic device 10. For instance, the transistor 66 may be proportional to and/or the same size as the transistor 24 such that the Ileak 68 matches the Ioff 34 when the power amplifier 12 is placed in a standby state. In some embodiments, the bleeder circuitry 36 may be configured to ensure that the current bled through the bleeder circuitry 36 is at least as large as an overall leakage current of the power amplifiers 12.

The voltage of VARY voltage bus may be based on this voltage VPERI. Accordingly, the voltages VPERI and VARY may change together. Specifically, when the power amplifier(s) 12 and/or the model 64 are turned off, the current mirrors 60 and 62 may be used to maintain VARY levels. In other words, the bleeder circuitry 36 may utilize the current mirrors 60 and 62 to sink the Ioff 34 for the power amplifiers 12. Otherwise, any currents Ioff 34 in the power amplifiers 12 may cause the VARY to be charged to a different voltage level. The sinkage of the leakage current via the bleeder circuitry 36 enables the VARY to remain consistent between on and standby states.

The current mirror 60 includes a transistor 69 that has a source coupled to the drain of the transistor 66. The current mirror 60 also includes a transistor 70. The transistors 69 and 70 are in respective legs of the current mirror with the gates of the transistors 69 and 70 tied together. The transistors 69 and 70 may have a same type as each other, such as a PMOS type. The source of the transistor 70 is coupled to the voltage VARY bus. The drain and gate of the transistor 70 are also tied together. Additionally, to compensate for an overall leakage current based on the model current, Ileak 68, the size of the transistor 70 may be a multiple of the size of the transistor 69. For instance, the size of the transistor 70 may be at least N times the size the size of the transistor 69, where N is the number of power amplifiers 12 in the electronic device 10. This enables the model 64 to use a much smaller current to emulate the leakage currents of many different power amplifiers 12.

The current mirror 62 is coupled to the current mirror 60. For instance, the current mirror 62 includes a transistor 72 that is coupled to the transistor 69. For instance, the drain of the transistor 69 may be coupled to the drain of the transistor 72. The source of the transistor 72 may be coupled to a common return, such as VSSDN or ground. The current mirror 62 also includes a transistor 74 that is coupled to the transistor 70. For instance, the drain of the transistor 70 may be coupled to the drain of the transistor 74. The transistors 72 and 74 may be of the same type as each other, such as an N-channel metal oxide semiconductor (NMOS) transistor. The source of the transistor 74 may be coupled to the common return, such as VSSDN or ground. In other words, the transistors 69 and 70 may be of a first type (e.g., PMOS) while the transistors 72 and 74 may be of another type (e.g., NMOS). Additionally, the gates of the transistors 72 and 74 are coupled together in the current mirror 62. Similar to the proportion of the sizes of the transistors 69 and 70, the sizes of the transistors 72 and 74 may be proportional. In fact, the proportion between the sizes of the transistors 72 and 74 may be the same as the proportion of the sizes of the transistors 69 and 70. In other words, the size of the transistor 74 may be a multiple of the size of the transistor 72. Indeed, the size of the transistor 74 may be at least N times greater than the size of the transistor 72, where N is the number of power amplifiers 12 in the electronic device 10. In some embodiments, the sizes of the transistors 69 and 70 may be proportional to each other while also much greater than the sizes of the transistors 72 and 74 that are also proportional to each other. Indeed, in certain embodiments, the sizes of the transistors 72 and 74 may be designed to reduce the sizes of the transistors 72 and 74 to as small as possible.

The current mirrors 60 and 62 provide a balanced loop that enables a relatively small current (e.g., <1 microamp to 10 microamps) to be used to compensate for multiple leakage currents using a compensation current Icomp 79. However, in some situations such as a startup condition, it may be possible that the current mirrors 60 and 62 may function independently to interfere with the described operation of the current mirrors 60 and 62 above. For instance, when VPERI=0, the voltage at the source of the transistor 69, the voltage at a node 76, the voltage at a node 78, and at the gates of transistors 72 and 74 may all be 0. However, upon startup when VPERI transitions high, the voltage at the node 76 may transition high with VPERI while it is possible that the voltage at the node 78 remains at 0. To mitigate the possibility of startup issues, in some embodiments, the bleeder circuitry 36 may include startup circuitry to address such potential issues.

Figure 5:
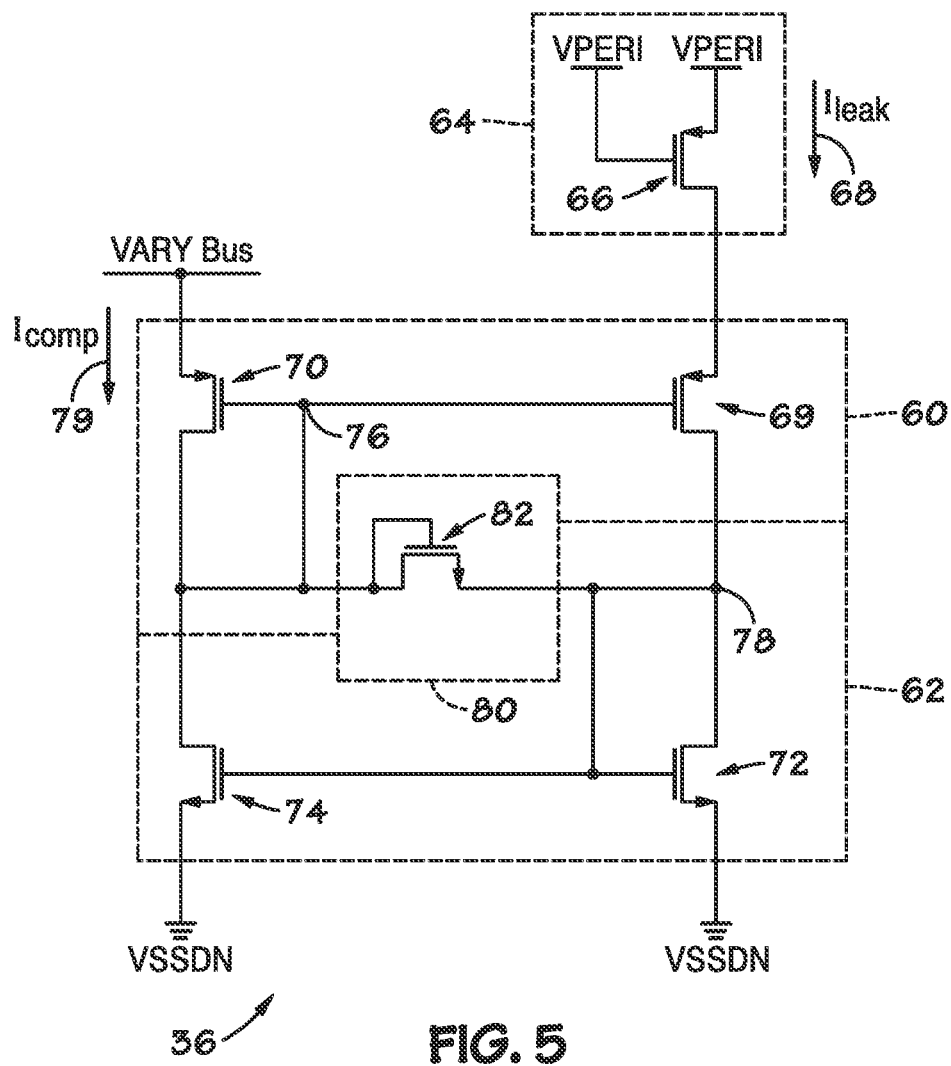
FIG. 5 is a circuit diagram of the current-mirror-based implementation of the bleeder circuitry of FIG. 4 with a startup transistor to balance the current-mirror-based implementation of the bleeder circuitry during a startup of the electronic device of FIG. 1, according to an embodiment of the present disclosure.

FIG. 5 is a schematic diagram of an embodiment of the current-mirror-based implementation of the bleeder circuitry 36 utilizing startup circuitry 80. Indeed, the bleeder circuitry 36 in FIG. 5 is identical to the bleeder circuitry 36 of FIG. 4 except that the bleeder circuitry 36 in FIG. 5 utilizes the startup circuitry 80. As illustrated, the startup circuitry 80 is coupled between the node 76 and the node 78. The startup circuitry 80 includes a transistor 82. The transistor 82 is coupled between the node 76 and the node 78. The transistor 82 may include an NMOS transistor or any other suitable type of transistor. A source of the transistor 82 may be coupled to the node 78. A drain of the transistor 82 may be coupled to the node 76. A gate of the transistor 82 may also be coupled to the node 78. During normal operation of the bleeder circuitry 36, the current through the transistor 82 may be minimal since the voltages of the node 76 and the node 78 may be really close in voltage levels. After startup, the voltage at the node 76 may be VARY-VTH, where VTH is the threshold voltage of the transistor 82. During such times, the voltage at the node 78 may be VTH. Furthermore, although the amplifier-based implementation of the bleeder circuitry 36 uses a somewhat consistent large current (e.g., 10-20 μA), the current mirror-based implementation of the bleeder circuitry 36 may use a smaller current (e.g.,<1 μA to 10 μA). Furthermore, the current mirror-based implementation of the bleeder circuitry 36 may vary based on process corner. For instance, in a TT process corner, the current mirror-based implementation of the bleeder circuitry 36 may use a current of less than 1 μA while the current used in an FF process corner may be 8-10 μA.

Although the foregoing discusses various logic-low and/or logic-high assertion polarities, at least some of these polarities may be inverted in some embodiments. While the present disclosure may be susceptible to various modifications and alternative forms, specific embodiments have been shown by way of example in the drawings and have been described in detail herein. For instance, PMOS and NMOS transistors may be swapped and polarities of voltages may be reversed. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device comprising:
    a voltage bus;
    one or more power amplifiers coupled to the voltage bus, wherein each of the one or more power amplifiers comprises one or more transistors;
    a model that is configured to emulate leakage from at least one of the one or more transistors; and a current mirror with a first transistor coupled to the model and a second transistor coupled to the voltage bus, wherein the current mirror is configured to draw charge from the voltage bus based at least in part on the emulated leakage from the model, wherein a gate of the first transistor is coupled to a gate of the second transistor and a drain of the second transistor.

2. The semiconductor device of claim 1, wherein the model comprises an emulation transistor configured to produce a leakage current through the transistor that is configured to emulate leakage from a power amplifier transistor of the one or more transistors of a power amplifier of the one or more power amplifiers.

3. The semiconductor device of claim 2, wherein the leakage current is greater than or equal to the leakage from the power amplifier transistor.

4. The semiconductor device of claim 2, wherein the power amplifier transistor emulates the leakage when the power amplifier transistor is in or transitions to a standby mode.

5. The semiconductor device of claim 1, wherein the second transistor is N times larger than the first transistor where N is a number of the one or more power amplifiers to have leakage mitigated.

6. The semiconductor device of claim 1, comprising an additional current mirror coupled to the current mirror, wherein the additional current mirror comprises a third transistor coupled to the first transistor and a fourth transistor coupled to the second transistor.

7. The semiconductor device of claim 6, wherein the first and second transistors comprise p-channel metal oxide semiconductors.

8. The semiconductor device of claim 7, wherein the third and fourth transistors comprise n-channel metal oxide semiconductors.

9. The semiconductor device of claim 6, wherein a gate of the fourth transistor is coupled to a gate and drain of the third transistor.

10. The semiconductor device of claim 6, wherein a drain of the first transistor is coupled to a drain of the third transistor, and the drain of the second transistor is coupled to a drain of the fourth transistor.

11. The semiconductor device of claim 6, comprising startup transistor between a node of the current mirror and a node of the additional current mirror to balance operation of the current mirror and the additional current mirror during startup of the semiconductor device.

12. The semiconductor device of claim 11, wherein the node of the current mirror is coupled to the gate of the first transistor and the gate and the drain of the second transistor, and the node of the additional current mirror is coupled to a gate of the fourth transistor and a gate and drain of the third transistor.

13. The semiconductor device of claim 6, wherein the fourth transistor is N times larger than the third transistor where N is a number of the one or more power amplifiers to have leakage mitigated.

14. The semiconductor device of claim 6, wherein the current mirror and additional current mirror consume different amounts of current for different process corners.

15. A method, comprising:
generating, using a model transistor, a modeled leakage current that models a leakage current in a transistor of a power amplifier;
transmitting the modeled leakage current to a first leg of a plurality of current mirrors coupled in series; and
using a second leg of the plurality of current mirrors coupled to a voltage bus, mitigating changes to the voltage bus due to leakage currents from a plurality of power amplifiers using a compensation current at the second leg that is based at least in part on the modeled leakage current.

16. The method of claim 15, wherein generating the modeled leakage current comprises placing the model transistor in a same state as the transistor when the model transistor is equal in size to the transistor and has a same type as the model transistor.

17. The method of claim 16, wherein the state comprises an off state.

18. A device, comprising:
a voltage bus;
a plurality of power amplifiers each comprising a transistor;
a model transistor configured to generate a modeled current leakage that emulates a leakage of the transistor of one of the plurality of power amplifiers; and
a plurality of current mirrors with respective first and second legs coupled in series between each of the plurality of current mirrors, wherein the plurality of current mirrors is configured to receive the modeled current leakage at a respective first leg of a current mirror of the plurality of current mirrors and to generate a compensation current at a respective second leg of the current mirror based on the modeled current leakage that mitigates voltage fluctuations on the voltage bus due to leakages from the plurality of power amplifiers.

19. The device of claim 18, wherein each current mirror comprises a first transistor in the respective first leg and a second transistor in the respective second leg, wherein each second transistor is N times larger than the respective first transistor of the same current mirror where N is the number of power amplifiers in the plurality of power amplifiers.

20. The device of claim 18, comprising a startup transistor coupled between two of the plurality of current mirrors.

21. The device of claim 18, wherein the model transistor is configured to model the current leakage when the transistor is in a standby state.

* * * * *